(12) United States Patent
Clavelier et al.

(10) Patent No.: US 7,608,491 B2
(45) Date of Patent: Oct. 27, 2009

(54) METHOD FOR MANUFACTURING A SOI SUBSTRATE ASSOCIATING SILICON BASED AREAS AND GAAS BASED AREAS

(75) Inventors: Laurent Clavelier, Grenoble (FR); Chrystel Deguet, Saint Ismier (FR)

(73) Assignee: Commissariat a l'Energie Atomique, Paris (FR)

( * ) Notice: Subject to any disclaimer, the term of this patent is extended or adjusted under 35 U.S.C. 154(b) by 123 days.

(21) Appl. No.: 11/959,924

(22) Filed: Dec. 19, 2007

(65) Prior Publication Data

US 2008/0153267 A1    Jun. 26, 2008

(30) Foreign Application Priority Data

Dec. 21, 2006    (FR) .................................. 06 55825

(51) Int. Cl.
*H01L 21/00* (2006.01)
(52) U.S. Cl. .................... 438/149; 257/E21.561
(58) Field of Classification Search .......... 438/149; 257/E21.561
See application file for complete search history.

(56) References Cited

U.S. PATENT DOCUMENTS

| | | | |
|---|---|---|---|
| 4,551,394 A | | 11/1985 | Betsch et al. |
| 5,514,885 A | * | 5/1996 | Myrick .................. 257/216 |
| 2004/0016395 A1 | | 1/2004 | Bensahel |
| 2006/0170045 A1 | * | 8/2006 | Yan et al. .................. 257/347 |
| 2008/0265281 A1 | * | 10/2008 | Chen et al. ................ 257/190 |

FOREIGN PATENT DOCUMENTS

FR    2 842 217 A1    1/2004

WO    WO 2004/010496 A1    1/2004

OTHER PUBLICATIONS

Mikio Takai, et al., "Gallium Arsenide Layers Grown by Molecular Beam Epitaxy on Single Crystalline Germanium Islands on Insulator", Japanese Journal of Applied Physics, vol. 23, No. 5, XP002440750, May 1984, pp. L308-L310.

* cited by examiner

*Primary Examiner*—Matthew Smith
(74) *Attorney, Agent, or Firm*—Oblon, Spivak, McClelland, Maier & Neustadt, L.L.P.

(57) ABSTRACT

The invention relates to a method for manufacturing an SOI substrate, associating silicon based areas and areas of GaAs based material at the thin layer of the SOI substrate, the SOI substrate comprising a silicon support supporting successively a layer of dielectric material and a thin layer of silicon. The method comprises the following steps:

supply of a SOI substrate comprising a silicon support mismatched by an angle of between 2° and 10° inclusive, the thin silicon based layer being oriented parallel to the plane (001) or (010), or (100) or (110) or (101) or (011) or (111), preservation of at least one area of the thin silicon layer, elimination of at least one non-preserved area of the thin silicon layer until the layer of dielectric material is revealed, opening, in said non-preserved area, of the layer of dielectric material until the silicon support is revealed, growth, from the silicon of the support revealed by said opening and by liquid phase epitaxy or by lateral epitaxy, of mismatched germanium on the layer of dielectric material revealed, growth of GaAs based material from the mismatched germanium obtained in the preceding step.

9 Claims, 2 Drawing Sheets

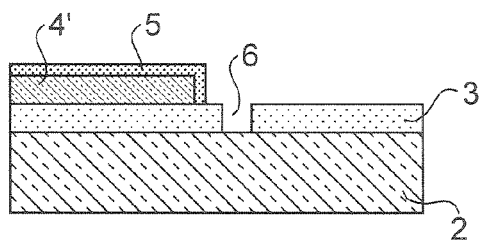
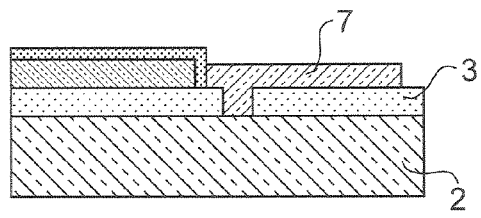
FIG.1G  FIG.1H
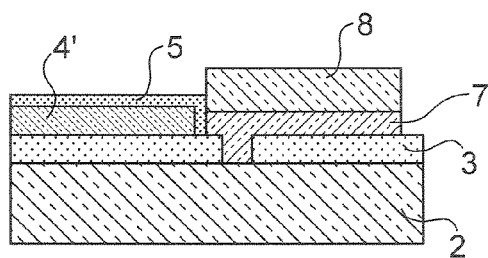
FIG.1I
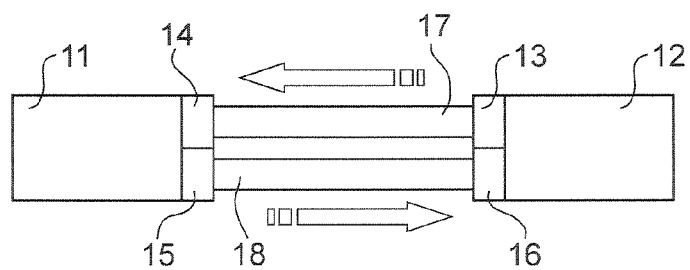
FIG.2

METHOD FOR MANUFACTURING A SOI SUBSTRATE ASSOCIATING SILICON BASED AREAS AND GAAS BASED AREAS

TECHNICAL FIELD

The invention relates to a method for manufacturing a SOI substrate associating silicon based areas and GaAs based areas. The expression "GaAs based material" means both the GaAs material and the ternary and quaternary compounds associated with GaAs, such as InGaAs, InGaAsP, InGaAsAl, etc.

STATUS OF THE PRIOR ART

Currently, microelectronics on silicon (CMOS) and the technology of GaAs based III-V semiconductor materials (a material much used for optronic applications) follow different technological production paths. Indeed, devices combining CMOS components and GaAs components are obtained generally by hybrid techniques such as transferring completed GaAs components to completed CMOS circuits and their electrical connections (for example by conducting wires or by bump techniques). One of the reasons for this is that the substrates used to produce CMOS circuits are not the same as those used to grow GaAs materials. CMOS circuits are produced on massive silicon substrates or on SOI (silicon on insulator) substrates, whereas GaAs materials are obtained by growing on germanium substrates or on GeOI (germanium on insulator) substrates, ideally mismatched by 6° relative to the planes (001) or again on massive GaAs substrates. These technical production paths currently make manufacturing CMOS circuits and growing GaAs on a single substrate impossible.

The technique for transfer/connection of GaAs components on to a CMOS circuit has a number of drawbacks. This technique is costly, mainly if several GaAs based components have to be transferred to a CMOS circuit. There is also a technological barrier to miniaturising objects. Indeed, transferring a GaAs component on to a CMOS circuit is now done with an accuracy of better than 1 µm, which requires very relaxed design rules to be used, whence great loss of space and a handicap for miniaturisation. This technique is also difficult to implement, as it requires greater efforts to be made (in terms of design, technology, etc.) in order to reduce coupling losses from one component relative to another and this all too frequently to the detriment of the performance of the components.

A monolithic integration on a single substrate, i.e. a substrate including both Si or SOI areas, to produce CMOS circuits, and Ge or GeOI mismatched areas (ideally by 6° relative to the planes (001)), in order to produce GaAs growth, can be employed to solve some of the abovementioned drawbacks.

The document WO 2004/010496 A1 discloses a method for producing a substrate having a GaAs area coexisting with a silicon area. The manufacture of such a substrate starts by bonding a layer of germanium on to a silicon substrate covered with a layer of silicon oxide. By partial elimination of the germanium layer followed by steps of growth, a silicon area adjacent to an epitaxial GaAs area on the germanium. This method has a number of drawbacks. The initial substrate is a GeOI substrate, therefore a rare and expensive substrate. The germanium used to grow the GaAs is not mismatched, which can cause problems with antiphase domains during the GaAs growth. The silicon devices are produced from massive silicon. Therefore, it is impossible to enjoy the electrostatic benefits of the SOI (reduction of short channel effects, reduction of junction capacitances, radio frequency gains, etc.). In general, this method does not allow SOI-GeOI—GaAsOI co-integration.

U.S. Pat. No. 6,171,936 B1 discloses a method for manufacturing a structure having GaAs areas coexisting with silicon areas, from which are formed SiGe areas via gradual SiGe buffer layers. The CMOS components are produced on the massive silicon and the GaAs layers are built up epitaxially on the germanium terminating the SiGe areas and from the non-mismatched areas of germanium. This method has a number of drawbacks. The silicon devices are produced on massive silicon, which has the same drawbacks as does the method from the document WO 2004/010496 A1. The GaAs layer is produced via the gradual growth of the buffer layers of SiGe, which have a significant thickness (several µm), which is costly and entails mechanical stress which can be harmful. Indeed, a distorted disc is difficult to process. Finally, GaAs is not "on insulator", which leads to the same remarks as for silicon devices.

SUMMARY OF THE INVENTION

The invention can remedy the drawbacks of the prior art.

It proposes a method for manufacturing an SOI substrate associating at least one silicon based area and at least one area of GaAs based material at the thin layer of the SOI substrate, the SOI substrate comprising a support having a silicon face supporting successively a layer of dielectric material and a thin silicon based layer, the method being characterised in that it comprises the following steps:

provision of a SOI substrate comprising a support having a silicon face mismatched by an angle of between 2° and 10° inclusive, the thin silicon based layer being oriented parallel to the plane (001) or (010) or (100) or (110) or (101) or (011) or (111), preservation of at least one area of the thin silicon layer, elimination of at least one non-preserved area of the thin silicon layer until the layer of dielectric material is revealed, opening, in said non-preserved area, of the layer of dielectric material until the silicon face of the support is revealed, growth, from the support silicon revealed by said opening and by liquid phase epitaxy or by lateral epitaxy, of mismatched germanium on the layer of dielectric material revealed, growth of GaAs based material from the mismatched germanium obtained in the preceding step.

More preferably, the support has a silicon face mismatched by an angle of between 4° and 8° inclusive. More preferably again, the support has a silicon face mismatched by an angle of 6°.

The step of preserving at least one layer of the thin layer of silicon can consist of depositing a protective layer on said area of the thin silicon layer.

The method can also incorporate the preservation of at least one germanium area obtained by growth in the thin layer of SOI substrate so as to prevent the growth of GaAs based material.

At least one component, specifically an electronic component, can be produced in said silicon area before the germanium growth step.

According to one embodiment, after growing the GaAs based material, at least one component, specifically an electronic component, is produced in the silicon area, then at least one component, specifically an optoelectronic component, is produced in the area of GaAs based material.

According to one particular application, at least one electronic component is produced in said silicon area, at least one receiver transforming an optical signal into an electrical signal is produced in said preserved germanium area, at least one transmitter transforming an electrical signal into an optical signal is produced in said area of GaAs based material, at least one first optical guide and a second optical guide are produced from a preserved area of the thin silicon layer, such that the first optical guide can convey an optical signal as far as the receiver, which sends an electrical signal corresponding to an input of the electronic component, and such that the second optical guide can convey an optical signal corresponding to an electrical signal transmitted by an output from the electrical component and passing through the transmitter.

BRIEF DESCRIPTION OF THE DRAWINGS

The invention will be better understood and other advantages and features will appear on reading the description which will follow, given by way of a non-limitative example, accompanied by the appended drawings, among which:

FIGS. 1A to 1I are sectional views from the side illustrating the method of manufacture according to this invention, FIG. 2 is a plan view showing an example of CMOS circuits connected by optical interconnections.

DETAILED EXPLANATION OF PARTICULAR METHODS OF PRODUCTION

The invention can produce on a single substrate both SOI areas appropriate for CMOS production (the orientation of the silicon layer for this area will be chosen according to the application, for example silicon (001) for CMOS applications) and GeOI areas (in which the layer of Ge is mismatched relative to the plane (001)) appropriate for the growth of GaAs. Le GaAs is advantageously used for its optical (laser) or electrical (HBT, HEMT or n-MOS transistors) properties, because the mobility of electrons in GaAs is very high.

FIGS. 1A to 1I are views from the side illustrating the method of manufacture according to this invention.

Figure 1A:
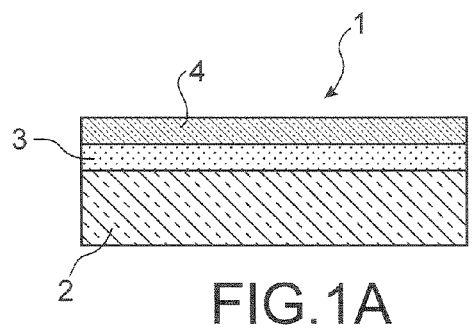

FIG. 1A shows a SOI substrate 1 appropriate for implementing this invention. The substrate 1 comprises a silicon (001) support 2, in which the normal to the plane is mismatched by an angle of between 2° and 10° inclusive, typically between 4° and 8° and ideally 6° towards the direction <111>. The support 2 supports a layer 3 of dielectric material and a thin layer 4 of silicon. The layer 3 of dielectric material can be $SiO_2$, $Si_3N_4$ or $Al_2O_3$. More preferably, this layer is thermal oxide. The thin layer 4 is silicon termed conventional, i.e. orientation parallel to the plane (001) or (010) or (100) or (110) or (101) or (011) or (111).

The continuation of the method will be capable of obtaining, in this embodiment, a substrate having, in the active layer, a silicon area and a GaAs area. To do this, the silicon in the thin layer is preserved and protected at the point wanted for the silicon area and the silicon in the thin layer is eliminated at the point wanted for the GaAs area.

Figure 1B:
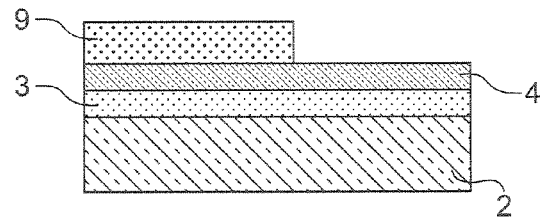
Figure 1C:
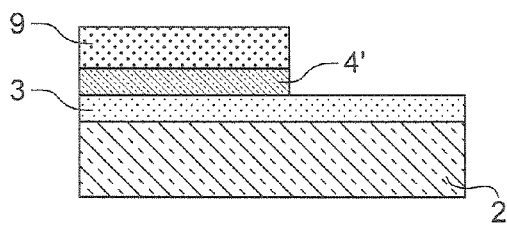

FIG. 1B shows a layer 9 of resin lithographed on the thin layer 4. As the layer 9 of resin forms a protective mask, the unmasked part of the thin layer 4 is etched until the layer 3 of dielectric material is revealed. Under the mask 9 of resin is an area 4' of silicon (see FIG. 1C).

Figure 1D:
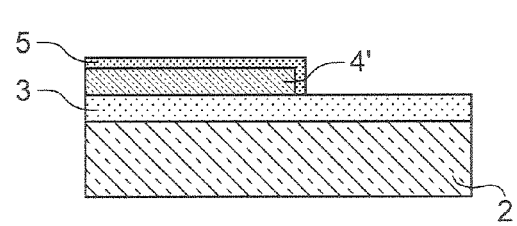

The resin mask is eliminated and a protective layer 5 constituting a hard mask is formed on the silicon area 4' (see FIG. 1D). The protective layer 5 can be $SiO_2$ or $Si_3N_4$. The technological constraint for this protective layer is its resistance to the technical budget induced by the growth of GaAs. The protective layer must provide a stop layer to the mechano-chemical polishing of the GaAS if polishing is necessary to level the GaAs and Si areas. It must be a material allowing the growth of GaAs if necessary.

Figure 1E:
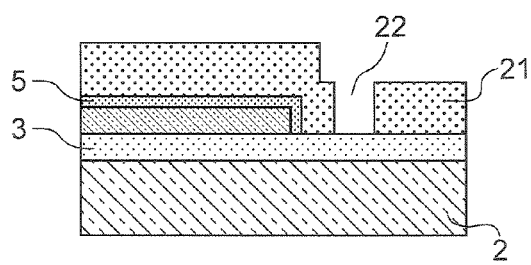
Figure 1F:
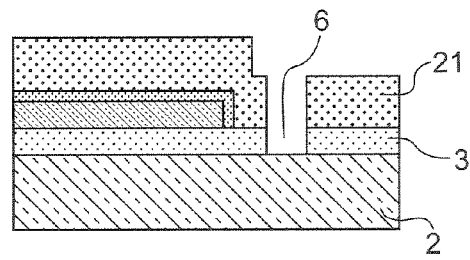

A layer 21 of resin is then deposited on the structure obtained (see FIG. 1E). The resin layer 21 is lithographed and has an opening 22 revealing the layer 3 of dielectric material. The layer 3 is then etched from the opening 22 until the silicon substrate 2 at the bottom of the opening 6 is revealed (see FIG. 1F).

The resin layer 21 is then eliminated. The structure shown in FIG. 1G is obtained. The silicon area revealed by the opening 6 will be used as the "seed" for growing the germanium.

From the silicon revealed by the opening 6, a mismatched germanium layer is grown at the same angle as for the silicon of the support. Thus, if the support 2 is silicon, mismatched by an angle of 6°, the germanium layer 7 obtained (see FIG. 1H) is also mismatched by 6°. The growth of the germanium can be obtained by the epitaxy technique termed LPE (for "Liquid Phase Epitaxy") or even by lateral epitaxy of germanium. Optionally, a mechano-chemical planarisation of the germanium can be carried out.

Then as shown in FIG. 1I, a GaAs layer is grown on the germanium layer 7. As the germanium and GaAs have matched mesh parameters, the mismatched angle of 6° of the germanium layer can avoid the problems related to antiphase domains during the growth. The protective layer 5 can then be eliminated to bare the silicon area 4' which is close to the GaAs area 8.

The silicon area will be able to produce components using CMOS technology. Chronologically, depending on the thermal budgets to which each type of component may be subjected, it is possible, for example, to produce:

first, MOSFETs on the SOI substrate (in the future silicon area) in FIG. 1A, then growth of germanium and GaAs and finally components on the GaAs area; or first, growth of germanium and GaAs, then MOSFETs on the silicon area and finally components on the GaAs area.

The invention is not limited to growing GaAs material. It applies also to ternary and quaternary compounds associated with GaAs, such as InGaAs, InGaAsP, InGaAsAl, etc.

By means of the invention, it is possible to obtain on a single substrate SOI areas, GeOI areas (while protecting a germanium area before growing GaAs on another germanium area) and GaAs on GeOI areas. This approach is interesting for producing circuits with optical intra-chip connections of the type:

CMOS and optical guides on SOI, light emitters (by transformation of an electrical signal into a light signal) on GaAs, light detectors (by transformation of a light signal into an electrical signal) on GeOI.

FIG. 2 is a top view illustrating this possibility. This view shows two CMOS circuits 11 and 12 produced on SOI, two light emitters 13 and 15 produced on GeOI, two light detectors 14 and 16 produced on GaAs and two optical guides 17 and 18 produced by using Si as the core of the guide and $SiO_2$ as confinement layers.

Thus, information flows can circulate in both directions between the CMOS circuits 11 and 12. An electrical signal emitted by the CMOS circuit 12 is transformed into a light signal by the light emitter 13. This light signal is conveyed by the optical guide 17 to the detector 14 which supplies an electrical signal to the CMOS circuit 11. An electrical signal emitted by the CMOS circuit 11 is transformed into a light signal by the light emitter 15. This light signal is conveyed by the optical guide 18 to the detector 16 which supplies an electrical signal to the CMOS circuit 12.

This approach can be used by playing both on the oxide thicknesses (by checking the etching and/or the deposit) and on the thickness of the epitaxial layers. For example, in the case of FIG. 4, it is possible to etch the buried oxide and control the thickness of the Ge, in order to be able to produce an emitter or a detector in the layer of GaAs which would be aligned with the active or passive components located in the layer of Si, in order to minimise the coupling losses.

The invention claimed is:

1. Method for manufacturing an SOI substrate associating at least one silicon based area (4') and at least one GaAs based material area (8) at the thin layer (1) of the SOI substrate, the SOI substrate comprising a support (2) having a silicon face supporting successively a layer (3) of dielectric material and a thin silicon based layer (4), the method being characterised in that it comprises the following steps:
   supply of a SOI substrate (1) comprising a support (2) having a silicon face mismatched by an angle of between 2° and 10° inclusive, the thin silicon based layer (4) being oriented parallel to the plane (001) or (010) or (100) or (110) or (101) or (011) or (111),
   preservation of at least one area (4') of the thin silicon based layer (4),
   elimination of at least one non-preserved area of the thin layer of silicon until the layer (3) of dielectric material is revealed,
   opening, in said non-preserved area, of the dielectric material layer (3) until the silicon face of the support (2) is revealed,
   growth, from the silicon of the support (2) revealed by said opening (6) and by liquid phase epitaxy or by lateral epitaxy, of mismatched germanium (7) on the dielectric material layer revealed,
   growth of the GaAs based material (8), from mismatched germanium (7) obtained in the preceding step.

2. Method according to claim 1, in which the support (2) has a silicon face mismatched by an angle of between 4° and 8° inclusive.

3. Method according to claim 2, in which the support (2) has a silicon face mismatched by an angle of 6°.

4. Method according to any one of claims 1 to 3, in which the dielectric material layer (3) is a material chosen from among $SiO_2$, $Si_3N_4$ and $Al_2O_3$.

5. Method according to any one of claims 1 to 4, in which the step of preserving at least one thin silicon layer area (4') consists of depositing a protective layer (5) on said area of the thin silicon layer.

6. Method according to any one of claims 1 to 5, also incorporating the preservation of at least one germanium area obtained by growth in the thin layer of the SOI substrate in order to prevent the growth there of GaAs based material.

7. Method according to any one of claims 1 to 6, in which at least one component is produced in said silicon area before the germanium growing step.

8. Method according to any one of claims 1 to 6, in which, after growing the GaAs based material, at least one component is produced initially in the silicon area, then at least one component in the area of GaAs based material.

9. Method according to claim 6, in which at least one electronic component (11, 12) is produced in said silicon area, at least one receiver (14, 16) transforming an optical signal into an electrical signal is produced in said preserved germanium area, at least one emitter (13, 15) transforming an electrical signal into an optical signal is produced in said area of GaAs based material, at least one first optical guide (17) and a second optical guide (18) are produced from a preserved area of the thin layer of silicon, such that the first optical guide (17) can convey an optical signal to the receiver (14, 16) which transmits a corresponding electrical signal to an input of the electronic component (11, 12), and such that the second optical guide (18) can convey an optical signal corresponding to an electrical signal emitted by an output of the electrical component (11, 12) and transiting through the emitter (13, 15).

* * * * *